United States Patent

Truong et al.

[11] Patent Number: 4,845,728
[45] Date of Patent: Jul. 4, 1989

[54] VLSI BINARY UPDOWN COUNTER

[75] Inventors: Trieu-Kie Truong; In-Shek Hsu, both of Pasadena; Irving S. Reed, Santa Monica, all of Calif.

[73] Assignee: The United States of America as represented by the Administrator of the National Aeronautics and Space Administration, Washington, D.C.

[21] Appl. No.: 143,434

[22] Filed: Jan. 13, 1988

[51] Int. Cl.$^4$ .................. H03K 23/56; H03K 21/16
[52] U.S. Cl. .................. 377/123; 377/111; 377/114; 377/116; 377/126; 377/69; 377/79; 307/471; 307/481
[58] Field of Search .................. 377/54–56, 377/67, 69, 73–74, 76, 78–81, 105–106, 116–117, 121, 123, 125, 111, 114, 115, 126, 69; 307/269, 471, 472, 481

[56] References Cited

U.S. PATENT DOCUMENTS

| | | | |
|---|---|---|---|
| 3,544,773 | 12/1970 | Peddie | 377/106 |
| 3,564,218 | 12/1971 | Lay | 377/116 |
| 3,588,475 | 6/1971 | Scott | 377/126 |
| 3,632,997 | 1/1972 | Froemke | 377/111 |
| 4,214,173 | 7/1980 | Popper | 377/117 |
| 4,418,418 | 11/1983 | Aoki | 377/79 |
| 4,509,183 | 4/1985 | Wright | 377/126 |
| 4,513,432 | 4/1985 | Gulati | 377/117 |
| 4,611,337 | 9/1986 | Evans | 377/123 |
| 4,637,038 | 1/1987 | Boyle | 377/117 |
| 4,741,006 | 4/1988 | Yamaguchi et al. | 377/116 |

FOREIGN PATENT DOCUMENTS 0006535  1/1987  Japan .................. 377/123

Primary Examiner—John S. Heyman
Assistant Examiner—Tai V. Duong
Attorney, Agent, or Firm—Thomas H. Jones; John R. Manning; Charles E. B. Glenn

[57] ABSTRACT

A pipeline binary updown counter is comprised of simple stages that may be readily replicated. Each stage is defined by the Boolean logic equation $$A_n(t) = A_n(t-1) \oplus [(U \cdot P_n) + (D \cdot Q_n)]$$

where $A_n(t)$ denotes the value of the nth bit at time t. The input to the counter has three values represented by two binary signals U and D such that if both are zero, the input is zero, if $U=0$ and $D=1$, the input is $-1$ and if $U=1$ and $D=0$, the input is $+1$. $P_n$ represents a product of $A_k$'s for $1 \leq k \leq -1$, while $Q_n$ represents the product of $\bar{A}$'s for $1 \leq k \leq n-1$, where $\bar{A}_k$ is the complement of $A_k$ and $P_n$ and $Q_n$ are expressed as the following two equations $$P_n = A_{n-1}A_{n-2} \ldots A_1$$

$$Q_n = \bar{A}_{n-1}\bar{A}_{n-2} \ldots \bar{A}_1$$

which can be written in recursion form as $$P_n = P_{n-1} \cdot A_{n-1}$$

$$Q_n = Q_{n-1} \cdot \bar{A}_{n-1}$$

with the initial values $P_1 = 1$ and $Q_1 = 1$.

3 Claims, 2 Drawing Sheets

NMOS SHIFT REGISTER (R)

VLSI BINARY UPDOWN COUNTER

ORIGIN OF INVENTION

The invention described herein was made in the performance of work under a NASA contract, and is subject to the provisions of Public Law 96-517 (35 USC 202) in which the Contractor has elected not to retain title.

BACKGROUND OF THE INVENTION

This invention relates to a binary updown counter, and more particularly to a pipeline counter with a reduced number of logic operations that can be implemented with regular, simple, expandable and, therefore, suitable architecture for very large scale integrated circuit (VLSI) implementation.

Large binary updown counters are widely used in digital circuits. Examples include the controller design of a servomotor or the correlator part of very long baseline interferometry. Shown in FIG. 1 is a typical prior-art VLSI design of an up counter which may be used as a model for an updown counter. A single one-bit register labeled R and half adder labeled H is required for each stage (order). The pulses to be counted are applied to the sum input terminal(s) of the half adder for the least significant stage of the counter. The true output (1) of the register is applied to the other input terminal of the half adder through a delay element D. The carry output (C) of the half adder is applied to the sum input of the next stage of higher order.

Such a counter may be readily expanded by replicating the one-bit stage. To adapt that design for an updown counter, only two one bit registers and a half adder are needed in each stage of an n-bit counter, and its expansion to more bits is very easy and straight forward. However, for it to be adapted to also counting down, a fixed value (bias) is added to the sum. Therefore, the sum "zero" represents the middle value of the range of the counter, and the smallest negative number is represented by "zero." Also, it takes n clock times to perform one counting operation in the worst case because of the ripple-carry feature.

To avoid the ripple-carry time for faster counting, it has been common to apply the input pulses simultaneously to all stages through AND gates, but the number of inputs to each gate increases as the size of the counter is increased. And of even more significance is the fact that each stage is different so that expansion by mere replication is no longer possible.

SUMMARY OF THE INVENTION

Because of the need to avoid the ripple-carry feature, and retain the ability to replicate stages, a new design of a large binary updown counter is required. In accordance with this invention, each stage of a clocked binary updown counter is defined by the Boolean logic equation:

$$A_n(t) = A_n(t-1) \oplus [(U \cdot P_n) + (D \cdot Q_n)] \quad (1)$$

where $A_n(t)$ denotes the value of the nth bit of the updown counter clocked at time t. Also in Eq. (1), the symbol $\oplus$ denotes the "exclusive OR" operation, the symbol "·" denotes the "AND" operation and the symbol "+" denotes the "inclusive OR" operation.

The input to the counter has three values represented by two binary signals U and D. If $U=0$ and $D=1$, then the input is "$-1$". If both U and D equal zero, then the input is "0". And if $U=1$ and $D=0$, then the input is "$+1$".

In Eq. (1), $P_n$ represents a product of $A_k$'s for $1 \leq k \leq n-1$, while $Q_n$ is the product of $\overline{A_k}$'s for $1 \leq k \leq n-1$, where $\overline{A_k}$ is the complemented value of $A_k$. Both $P_n$ and $Q_n$ are expressed as the following two equations:

$$P_n = A_{n-1} A_{n-2} \ldots A_1 \quad (2a)$$

$$Q_n = \overline{A}_{n-1} \overline{A}_{n-2} \ldots \overline{A}_1 \quad (2b)$$

Equations 2a and 2b can be rewritten in recursion form as $$P_n = P_{n-1} \cdot A_{n-1} \quad (3a)$$

and $$Q_n = Q_{n-1} \cdot \overline{A}_{n-1} \quad (3b)$$

with the values $P_1 = 1$ and $Q_1 = 1$ for the first stage.

The design of this new updown counter is simple, regular and expandable. Also, only one clock time is needed to perform one counting operation. Using this new architecture, it has been verified that a 64-bit binary updown counter can be put readily on a single VLSI chip with current NMOS technology. An example describing the pipeline architecture as well as the simplicity of each basic cell of this new counter is illustrated completely for a 3-bit counter which may be readily expanded to the more general case of an n-bit counter.

The novel features that are considered characteristic of this invention are set forth with particularity in the appended claims. The invention will best be understood from the following description when read in connection with the accompanying drawings.

DESCRIPTION OF PREFERRED EMBODIMENTS

Figure 1:
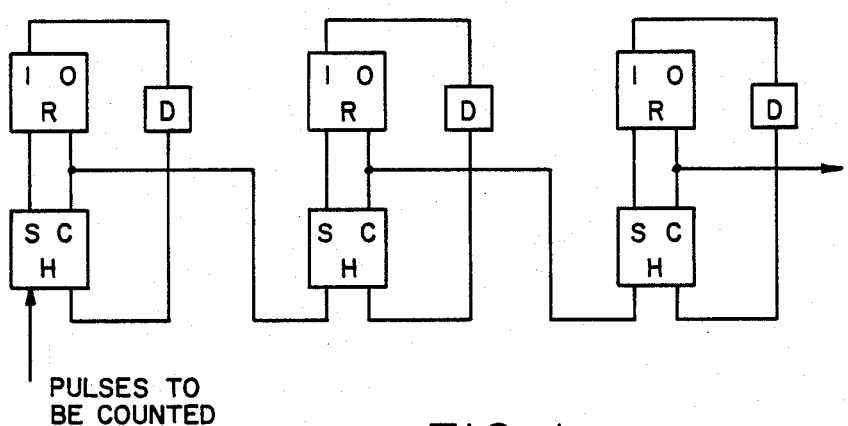
FIG. 1 is a diagram of a prior-art up counter using a single one-bit register and a half adder per stage.
Figure 2:
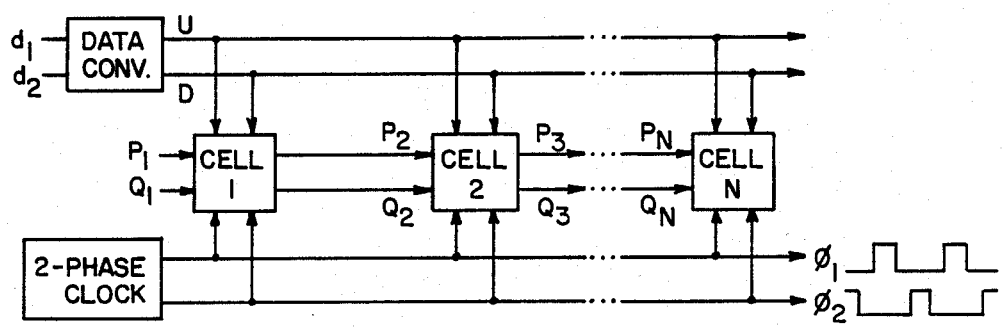
FIG. 2 is a logic diagram of a basic cell of the n-bit updown counter of FIG. 3 which implements Eq. (1).

Referring now to FIG. 2 of the drawings, an N-bit updown counter is comprised of a plurality of cells or stages 1, 2 ... N, each implemented in accordance with Eq. (1) above in a manner shown in FIG. 3. The input has three values, namely $-1$, 0, and $+1$. These three values are represented by binary coded signals $d_1 d_2$ which are converted into up (U) and down (D) count control signals in accordance with the following truth table:

| value | $d_1$ | $d_2$ | D | U |
|---|---|---|---|---|
| $-1$ | 1 | 0 | 1 | 0 |
| 0 | 0 | 0 | 0 | 0 |
| $+1$ | 0 | 1 | 0 | 1 |

It is evident that a data converter is not needed if the input values are represented in accordance with this $d_1d_2$ code. However, it is required in general to match the signal level of the counter to the external system, and to provide input signals U, D capable of driving n cells in parallel. In that case, the data converter is composed of simply a suitable pair of driver amplifiers. If the input value is $+1$, $U=1$ and $D=0$. If the input value is $-1$, then $U=0$ and $D=1$. If the input value is zero, both U and D are zero, and the contents of the counter should remain unchanged. Otherwise $A_n$ is not equal to $A_n(t-1)$, but changes from 1 to 0, or 0 to 1.

It is easily verified from Eq. (1) that when $U=D=0$, the output of cell n is $A_n(t)=A_n(t-1)$, where n is any one of the cells in the counter. This is so because when both U and D are zero, the second term of Eq. (1) is zero, and by the property of "exclusive OR," the output of the cell is equal to the remaining term $A_n(t-1)$.

On the other hand, if the input value is $+1$, then $U=1$ and $D=0$. The second term of Eq. (1) is then changed to $(1 \cdot P_n)+(0 \cdot Q_n)=P_n$. This equals 1 if $P_n=1$ which implies that $A_n=A_{n-1}$. In counting up, the value of the nth bit changes from zero to one if the value of the input to the counter is a 1, and the values of cells 1 to $n-1$ are all ones. This fact is truthfully reflected by Eq. (1). A similar argument applies to the case when the input value to the counter is a $-1$, i.e., the counter is counting down.

Assuming a 3-bit binary updown counter, the following truth table which defines its operation is as follows:

| D | U | $A_3(t)$ | $A_2(t)$ | $A_1(t)$ | $A_3(t+1)$ | $A_2(t+1)$ | $A(t+1)$ |
|---|---|---|---|---|---|---|---|
| 0 | 1 | 0 | 0 | 0 | 0 | 0 | 1 |
| 0 | 1 | 0 | 0 | 1 | 0 | 1 | 0 |
| 0 | 1 | 0 | 1 | 0 | 0 | 1 | 1 |
| 0 | 1 | 0 | 1 | 1 | 1 | 0 | 0 |
| 0 | 1 | 1 | 0 | 0 | 1 | 0 | 1 |
| 0 | 1 | 1 | 0 | 1 | 1 | 1 | 0 |
| 0 | 1 | 1 | 1 | 0 | 1 | 1 | 1 |
| 0 | 1 | 1 | 1 | 1 | 0 | 0 | 0 |
| 1 | 0 | 0 | 0 | 0 | 1 | 1 | 1 |
| 1 | 0 | 0 | 0 | 1 | 0 | 0 | 0 |
| 1 | 0 | 0 | 1 | 0 | 0 | 0 | 1 |
| 1 | 0 | 0 | 1 | 1 | 0 | 1 | 0 |
| 1 | 0 | 1 | 0 | 0 | 0 | 1 | 1 |
| 1 | 0 | 1 | 0 | 1 | 1 | 0 | 0 |
| 1 | 0 | 1 | 1 | 0 | 1 | 0 | 1 |
| 1 | 0 | 1 | 1 | 1 | 1 | 1 | 0 |

In the fourth row of the table, $D=0$, $U=1$, $A_3(t)=0$, $A_2(t)=1$ and $A_1(t)=1$. This corresponds to the case for which the contents of counter is decimal three in binary notation and the input is $+1$. Obviously, the next count should equal four, namely, $A_3(t+1)=1$, $A_2(t+1)=0$ and $A_1(t+1)=0$. Substituting these values of $A_i$, for $i=1, 2, 3$, as well as the values $U=1$, $D=0$ into Eq. (1), yields the following results:

$$\begin{aligned} A_3(t+1) &= A_3(t) \oplus (U \cdot P_3 + D \cdot Q_3) \quad (4)\\ &= 0 \oplus (1 \cdot 1 + 0 \cdot 0)\\ &= 0 \oplus 1\\ &= 1 \end{aligned}$$

$$\begin{aligned} A_2(t+1) &= A_2(t) \oplus ((U \cdot P_2 + (D \cdot Q_2)) \quad (5)\\ &= 1 \oplus ((1 \cdot 1) + (0 \cdot 0))\\ &= 1 \oplus 1\\ &= 0 \end{aligned}$$

$$\begin{aligned} A_1(t+1) &= A_1(t) \oplus ((U \cdot P_1) + (D \cdot Q_1)) \quad (6)\\ &= 1 \oplus ((1 \cdot 1) + (0 \cdot 0))\\ &= 1 \oplus 1\\ &= 0 \end{aligned}$$

where $P_3=A_1 \cdot A_2=1$ and $Q_3=\overline{A}_1 A_2 = 0$. The rest of the states of the table can be verified in a similar manner.

In a VLSI architecture of the present invention, an N-bit binary updown counter is comprised of N basic cells as well as a data converter (data mapping programmable logic array) for the input, as shown in FIG. 2, with each cell defined by Eq. (1) conforming to the logic diagram of FIG. 3. The up and down control signals U and P are connected to each cell as a direct input, while the cells are connected in cascade with inputs $Q_i$ and $P_i$ from a preceding stage and outputs $Q_{i+1}$ and $P_{i+1}$ to the next stage, and a count output $A_i$ from a one-bit register $RA_i$. The outputs $Q_{i+1}$ and $P_{i+1}$ are stored in one-bit registers $RQ_{i+1}$ and $RP_{i+1}$ of the next stage. The inputs to the ith basic cell are U, D, $P_i$ and $Q_i$ while the outputs are U, D, $P_{i+1}$, $Q_{i+1}$ and $A_i$. Outputs $P_{i+1}$ and $Q_{i+1}$ are obtained by the calculation of Eqs. (2a) and (2b). For an N-bit binary updown counter, N identical basic cells are required in the design.

Figure 3:
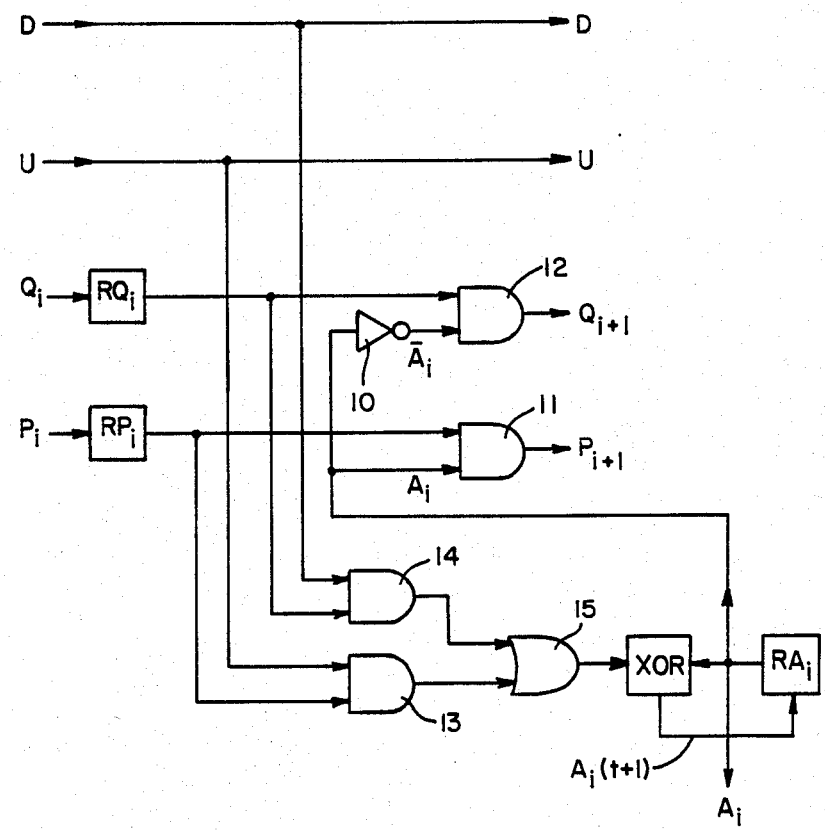
FIG. 3 is a logic diagram of a basic cell of the n-bit updown counter of FIG. 2 which implements Equation (1).
Figure 4:
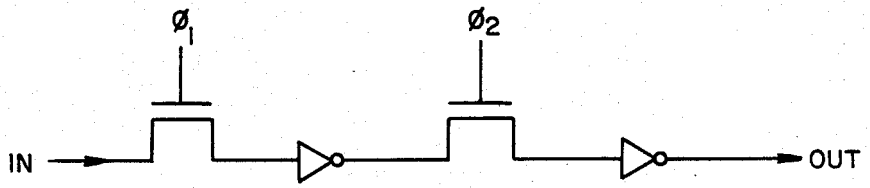
FIG. 4 is a logic diagram of a one-bit, two-phase shift register used in the basic cell shown in FIG. 3.

Referring to FIG. 3, the basic cell consists of three one-bit shift registers, as noted above, where registers labeled $RQ_i$ and $RP_i$ are used to store inputs $Q_i$ and $P_i$ respectively. Register $RA_i$ stores the output $A_i$. The output of $RA_i$ is sent to an exclusive OR circuit (XOR) for calculating the value of $A_i(t+1)$. In the meantime, $A_i$ and its complement $_i$ formed by an inverter 10 are sent to two AND gates 11 and 12 for the calculation of $P_{i+1}$ and $Q_{i+1}$. Two AND gates 13 and 14 and an OR gate 15 are provided to perform the Boolean logic $(U \cdot P_n)+(D \cdot Q_n)$. A two-phase nonoverlapping clock is applied to each register as shown in FIG. 4 which illustrates a one-bit NMOS shift register. That NMOS design is used to implement each of the one-bit registers $RQ_i$, $RP_i$ and $RA_i$ shown in FIG. 3 in order to simplify timing control.

As was described previously, the values of, are $P_1=Q_1=1$. Therefore the inputs to registers of the first basic cell $RP_1$ and $RQ_1$ are tied to VDD which is always at the "1" logic level. $A_i$, for $1 \leq i \leq n$ are the outputs representing the results of counting. The final value is obtained N clock periods after the last input $d_1$, $d_2$ into the counter. In that regard, it should be noted that the architecture of the counter is aptly described as a pipeline architecture in that while inputs $d_1$, $d_2$ may be processed in sequence at the two-phase clock rate, the counting operation proceeds, and intermediate values are stored in registers RA. Then N clock periods later, after the last input $d_1$, $d_2$ has been processed, the registers RA contain the final count of $d_1$, $d_2$ inputs.

Although particular embodiments of the invention have been described and illustrated herein, it is recognized that modifications and variations may readily occur to those skilled in the art. Consequently, it is intended that the claims be interpreted to cover such modifications and variations.

What is claimed is:

1. A binary updown counter comprising a plurality of pipelined stages connected in cascade, each stage being identical to every other stage and having means for performing operations defined by the Boolean logic equation $$A_n(t) = A_n(t-1) \oplus [(U \cdot P_n) + (D \cdot Q_n)]$$

where $A_n(t)$ denotes the value of the nth bit produced at time t, the input to the counter connected directly to each stage in parallel has three values represented by two binary signals U and D according to the table

| UD | value | value | UD |
|----|-------|-------|----|
| 0 1 | −1 | −1 | 0 1 |
| 0 0 | 0 | 0 | 0 0 |
| 1 0 | +1 | +1 | 1 0 |

$P_n$ represents a product of $A_k$'s for $1 \leq k \leq n-1$, while $Q_n$ represents a product of $\overline{A}_k$'s for $1 \leq k \leq n-1$, where $\overline{A}_k$ is the complemented value of $A_k$, and both $P_n$ and $Q_n$ are expressed as $P_n = P_{n-1} \cdot A_{n-1}$ and $Q_n = [Q_{n-1} \cdot A_v \mp_a] Q_{n-1} \cdot A_{n-1}$ with the initial values $P_1 = 1$ and $Q_1 = 1$.

2. A binary updown counter as defined in claim 1 wherein each stage defined by the Boolean logic equation consists of three one-bit shift registers $RQ_i$ and $RP_i$ used to store inputs $Q_i$ and $P_i$, respectively, and register $RA_i$ is used to store the circuit output $A_i$, a pair of AND gates and an OR gate are provided to perform the Boolean logic $(U \cdot P_n) + (D \cdot Q_n)$, means for transmitting said output $A_i$ and its complement $\overline{A}_i$ from the register $RA_i$ to another pair of AND gates for calculating $P_{i+1}$ and $Q_{i+1}$, and an exclusive OR circuit to receive the output $A_i$ for calculating the value of $A_i(t+1)$, where $t+1$ denotes the next clock time.

3. A binary updown counter as defined in claim 2 wherein each one-bit shift register is comprised of a first NMOS transistor receiving one of two out of phase nonoverlapping clock pulses $\phi_1$ and $\phi_2$ followed by a first inverter and a second NMOS transistor receiving the other one of two nonoverlapping out of phase clock pulses following said first inverter and followed by a second inverter.

* * * * *